(12) United States Patent
Ito et al.

(10) Patent No.: US 9,054,305 B2
(45) Date of Patent: Jun. 9, 2015

(54) NONVOLATILE MEMORY DEVICE AND METHOD OF MANUFACTURING THE SAME

(71) Applicant: Panasonic Intellectual Property Management Co., Ltd., Osaka (JP)

(72) Inventors: Satoru Ito, Hyogo (JP); Yoshio Kawashima, Osaka (JP); Yukio Hayakawa, Kyoto (JP); Takumi Mikawa, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/207,763

(22) Filed: Mar. 13, 2014

(65) Prior Publication Data

US 2014/0264249 A1  Sep. 18, 2014

(30) Foreign Application Priority Data

Mar. 18, 2013  (JP) .................................. 2013-055745

(51) Int. Cl.
  *H01L 47/00* (2006.01)
  *H01L 45/00* (2006.01)
  *H01L 27/22* (2006.01)

(52) U.S. Cl.
  CPC ............ *H01L 45/1253* (2013.01); *H01L 45/16* (2013.01); *H01L 45/04* (2013.01); *H01L 45/08* (2013.01); *H01L 45/085* (2013.01); *H01L 45/1233* (2013.01); *H01L 45/146* (2013.01); *H01L 45/1675* (2013.01); *H01L 27/222* (2013.01)

(58) Field of Classification Search
  CPC .................................................. H01L 45/1233
  See application file for complete search history.

(56) References Cited

U.S. PATENT DOCUMENTS

| 8,859,344 B2* | 10/2014 | Matsui et al. ................. 438/131 |
| 8,866,120 B2* | 10/2014 | Matsui et al. ..................... 257/3 |
| 8,890,107 B2* | 11/2014 | Matsui et al. ..................... 257/3 |
| 2002/0070379 A1* | 6/2002 | Dennison ......................... 257/5 |
| 2007/0170413 A1* | 7/2007 | Matsui et al. ..................... 257/3 |
| 2009/0035514 A1* | 2/2009 | Kang et al. .................... 428/131 |
| 2009/0096568 A1* | 4/2009 | Hosoi et al. ..................... 338/20 |

(Continued)

FOREIGN PATENT DOCUMENTS

| JP | 2004-087807 | 3/2004 |
| WO | 2008/059701 | 5/2008 |

(Continued)

*Primary Examiner* — Allan R Wilson
*Assistant Examiner* — Christine C Lau
(74) *Attorney, Agent, or Firm* — Wenderoth, Lind & Ponack, L.L.P.

(57) ABSTRACT

A nonvolatile memory device includes a plurality of nonvolatile memory elements each having an upper electrode, a variable resistance layer, and a lower electrode; a first insulating layer embedding the plurality of nonvolatile memory elements, and ranging from a lowermost part of the lower electrode to a position higher than an uppermost part of the upper electrode in each of the nonvolatile memory elements; a second insulating layer being formed on the first insulating layer, and having an average size of vacancies larger than an average size of vacancies included in the first insulating layer, or having an average carbon concentration higher than an average carbon concentration of the first insulating layer; and a conductive layer penetrating the second insulating layer and a part of the first insulating layer and being connected to at least one of the upper electrodes included in the nonvolatile memory elements.

18 Claims, 6 Drawing Sheets

(56) References Cited

U.S. PATENT DOCUMENTS

| | | | |
|---|---|---|---|
| 2009/0101884 A1* | 4/2009 | Tu | 257/3 |
| 2009/0224224 A1 | 9/2009 | Fujii et al. | |
| 2010/0210068 A1* | 8/2010 | Lee et al. | 438/102 |
| 2010/0252795 A1* | 10/2010 | Song et al. | 257/2 |
| 2011/0006278 A1* | 1/2011 | Takahashi | 257/4 |
| 2011/0049454 A1* | 3/2011 | Terao et al. | 257/2 |
| 2011/0294259 A1 | 12/2011 | Kanzawa et al. | |
| 2012/0068148 A1 | 3/2012 | Kawashima et al. | |
| 2013/0112935 A1* | 5/2013 | Himeno et al. | 257/4 |
| 2013/0121063 A1 | 5/2013 | Tsuji et al. | |

FOREIGN PATENT DOCUMENTS

| | | | |
|---|---|---|---|
| WO | 2008/149484 | 12/2008 | |
| WO | WO 2009057212 A1 * | 5/2009 | H01L 27/06 |
| WO | 2010/084774 | 7/2010 | |
| WO | 2011/111361 | 9/2011 | |
| WO | 2012/042828 | 4/2012 | |

\* cited by examiner

NONVOLATILE MEMORY DEVICE AND METHOD OF MANUFACTURING THE SAME

BACKGROUND OF THE INVENTION

1. Field of the Invention

The present disclosure relates to a variable resistance nonvolatile memory device which has a resistance value that changes according to application of electrical signal, and a method of manufacturing the same.

2. Description of the Related Art

In recent years, the performance of electronic devices such as mobile information devices and information appliances has advanced with the development of the digital technology. Thus, it is increasingly required to enhance capacity of a nonvolatile memory device, to reduce power consumption in a writing operation or the like, to increase speed in writing and reading operations, and to realize a long lifetime. It has been difficult to meet the above requirements using a flush memory having a conventional floating gate, as there is a limit on miniaturization of such a flush memory. Among nonvolatile memory elements, a so-called variable resistance element uses a variable resistance material as a material of a memory. The variable resistance element can be composed with a simple structure. Therefore, further miniaturization, higher speed, and lower power consumption can be expected, and thus it has been promoted to research and develop such a variable resistance element.

Here, the variable resistance element refers to an element having a property in which a resistance state reversibly changes in response to application of a voltage pulse, and having a capability of nonvolatily storing information by relating the information to each of the resistance states.

More specifically, the variable resistance element has a simple configuration in which a variable resistance layer made of variable resistance material is provided between a lower electrode layer and an upper electrode layer. In a case of a bipolar variable resistance element, a resistance change phenomenon occurs in the variable resistance layer when a voltage pulse having a different polarity is applied between the lower electrode layer and the upper electrode layer (between the electrodes). That is, for example, when a negative voltage pulse is applied between the electrodes, a state of the variable resistance layer becomes a low resistance state. Conversely, when a positive voltage pulse is applied between the electrodes, a state of the variable resistance layer becomes a high resistance state.

For example, this variable resistance element can store two values by allocating "0" to one of the low resistance state and the high resistance state, and "1" to the other thereof. The nonvolatile memory device having the variable resistance element is a memory device in which information corresponding to the resistance state is written to or read from each variable resistance element, by using the property in which the variable resistance layer changes between at least two states of the high resistance state and the low resistance state.

As for a technique regarding the variable resistance element, for example, PCT International Publication Nos. WO2008/149484 and WO2008/059701 each disclose a variable resistance element that has a variable resistance layer including two tantalum oxide layers of different oxygen content atomic percentages.

PCT International Publication No. WO 2008/149484 discloses a nonvolatile memory element including a lower electrode, an upper electrode, and a variable resistance layer interposed between the lower electrode and the upper electrode, and having a resistance value that reversibly changes based on an electrical signal that has a different polarity and is applied between both of the electrodes. The variable resistance layer has a first region that contains a first oxygen-deficient tantalum oxide having a composition represented by $TaO_x$ ($0<x<2.5$), and a second region that contains a second oxygen-deficient tantalum oxide having a composition represented by $TaO_y$ ($x<y<2.5$). The first region and the second region are stacked in a thickness direction of the variable resistance layer.

PCT International Publication No. WO 2008/059701 discloses a nonvolatile memory element including a first metal line; a plug formed on the first metal line and connected to the first metal line; a stacked structure including a lower electrode, an upper electrode, and a variable resistance layer, the stacked structure being formed on the plug which is connected to the lower electrode; a second metal line formed on the stacked structure and directly connected to the upper electrode; and a side wall protective layer covering a side wall of the stacked structure and having an insulating property and an oxygen barrier property. A part of a lower surface of the second metal line is positioned lower than an upper surface of the stacked structure.

SUMMARY OF THE INVENTION

It is required to perform reading and writing operations using a variable resistance element at lower voltage and higher speed in order to meet further low power consumption and high speed operation in a nonvolatile memory device.

The present disclosure provides a technique of reducing power consumption required for reading and writing operations and of increasing operation speed in the nonvolatile memory device.

A nonvolatile memory device according to one aspect of the present disclosure includes a plurality of nonvolatile memory elements each having an upper electrode, a lower electrode, and a variable resistance layer disposed between the lower electrode, the variable resistance layer having a resistance value that reversibly changes according to an electrical signal applied to the variable resistance layer; a first insulating layer embedding the plurality of the nonvolatile memory elements, and ranging from a lowermost part of the lower electrode to a position higher than an uppermost part of the upper electrode in each of the nonvolatile memory elements; a second insulating layer formed on the first insulating layer, and having an average size of vacancies larger than an average size of vacancies included in the first insulating layer, or having an average carbon concentration higher than an average carbon concentration of the first insulating layer; and a conductive layer penetrating the second insulating layer and a part of the first insulating layer and being connected to at least one of the upper electrodes of the nonvolatile memory elements.

According to the nonvolatile memory device of the aspect of the present disclosure, parasitic capacity of the insulating layer existing between the separated and adjacent conductive layers can be reduced, and charging and discharging of the parasitic capacity are suppressed, so that the power consumption required for the reading and writing operations in the nonvolatile memory device can be reduced, and the operation speed can be increased.

DETAILED DESCRIPTION OF THE PREFERRED EMBODIMENTS

According to one aspect of the present disclosure, a nonvolatile memory device includes a plurality of nonvolatile memory elements each having an upper electrode, a lower electrode, and a variable resistance layer disposed between the lower electrode and the upper electrode, the variable resistance layer having a resistance value that reversibly changes according to an electrical signal applied to the variable resistance layer; a first insulating layer embedding the plurality of nonvolatile memory elements, and ranging from a lowermost part of the lower electrode to a position higher than an uppermost part of the upper electrode in each of the nonvolatile memory elements; a second insulating layer formed on the first insulating layer, and having an average size of vacancies larger than an average size of vacancies included in the first insulating layer, or having an average carbon concentration higher than an average carbon concentration of the first insulating layer; and a conductive layer penetrating the second insulating layer and a part of the first insulating layer and being connected to at least one of the upper electrodes of the nonvolatile memory elements.

According to this aspect, the second insulating layer in the nonvolatile memory device has the average size of vacancies larger than the average size of vacancies included in the first insulating layer, or has the average carbon concentration higher than the average carbon concentration of the first insulating layer. Thus, a relative dielectric constant of the second insulating layer is lower than a relative dielectric constant of the first insulating layer. In addition, when the second insulating layer has the average size of vacancies larger than the average size of vacancies the first insulating layer, a film density of the second insulating layer is lower than the film density of the first insulating layer and mechanical strength of the first insulating layer is smaller than the mechanical strength of the first insulating layer. Similarly, when the carbon concentration of the second insulating layer is higher than that of the first insulating layer, the mechanical strength of the second insulating layer is smaller than that of the first insulating layer. Therefore, according to the nonvolatile memory device in this aspect, since the second insulating layer having the mechanical strength smaller than that of the first insulating layer is not contact with the upper electrode, there is no possibility that a pattern defect occurs due to the peeling between the second insulating layer and the upper electrode. Furthermore, since the first insulating layer and the second insulating layer having the relative dielectric constant lower than the relative dielectric constant of the first insulating layer are disposed beside the conductive layer, it is possible to further reduce parasitic capacity provided due to the insulating layer existing between the separated adjacent conductive layers, compared with the case where the conductive layer is only embedded with the first insulating layer. As a result, the charging and discharging of the parasitic capacity can be suppressed, so that power consumption at the time of writing and reading operations in the selected nonvolatile memory element among the conductive layers can be reduced, and the operation speed can be increased.

Furthermore, according to the aspect of the nonvolatile memory device, the first insulating layer may be physically in contact with at least one of an upper surface and a side wall of the upper electrode included in each of the nonvolatile memory elements.

Furthermore, according to the aspect of the nonvolatile memory device, a lowermost part of the conductive layer may be positioned higher than a lowermost part of the upper electrode of each of the nonvolatile memory elements.

Furthermore, according to the aspect of the nonvolatile memory device, a width of the conductive layer may be larger than a width of an upper surface of the upper electrode connected to the conductive layer, in each of the nonvolatile memory elements, and the conductive layer connected to the upper electrode may cover the whole upper surface of the upper electrode.

Furthermore, according to the aspect of the nonvolatile memory device, the conductive layer may include at least one of a line and a via.

Furthermore, according to the aspect of the nonvolatile memory device, the upper electrode included in each of the nonvolatile memory elements may contain at least one metal selected from the group consisting of iridium, platinum, gold, silver, and palladium.

Furthermore, according to another aspect of the present disclosure, a nonvolatile memory device includes a plurality of nonvolatile memory elements each having an upper electrode, a lower electrode, and a variable resistance layer disposed between the lower electrode and the upper electrode, the variable resistance layer having a resistance value that reversibly changes according to an electrical signal applied to the variable resistance layer; a first insulating layer embedding the plurality of the nonvolatile memory elements, and ranging from a lowermost part of the lower electrode to a position higher than an uppermost part of the upper electrode in each of the nonvolatile memory elements; a second insulating layer formed on the first insulating layer, and having an average size of vacancies larger than average size of vacancies included in the first insulating layer, or having an average carbon concentration higher than an average carbon concentration of the first insulating layer; a conductive layer penetrating the second insulating layer and a part of the first insulating layer and connected to at least one of the upper electrodes of the nonvolatile memory elements; and a plurality of side wall protective layers each for covering a side wall of each of the nonvolatile memory elements as an insulating protective layer, and each covering at least a side surface of the variable resistance layer.

According to this aspect, since the side wall protective layer is provided, it is possible to suppress entering of the oxygen into the side surface of the variable resistance layer from the insulating layer (such as the first insulating layer), in the process of forming the insulating layer and in a heat treatment process after the nonvolatile memory element has been formed. As a result, it is possible to suppress oxidation of the side surface of the variable resistance layer, and a variation in effective cross-sectional area of the variable resistance layer. Furthermore, since the side wall of the stacked structure is covered with the side wall protective layer, it is possible to suppress a leak path being formed between the conductive layer and the variable resistance layer, in the process of forming the conductive layer. As a result, according to the nonvolatile memory element in the exemplary embodiment of the present disclosure, it is possible to suppress a variation in voltage applied to the nonvolatile memory element when the resistance changes, thus a reduction in yield can be suppressed.

Furthermore, according to still another aspect of the nonvolatile memory device, a part of the side wall of the upper electrode not covered with each of the side wall protective layers may be covered with at least one of the first insulating layer and the conductive layer.

According to yet another aspect of the nonvolatile memory device, a lowermost part of the conductive layer may be positioned between an uppermost part and a lowermost part of the upper electrode of the nonvolatile memory element and is contact with the side wall protective layer.

Furthermore, according to yet another aspect of the nonvolatile memory device, a lowermost part of the conductive layer may be positioned beside the variable resistance layer provided under a lowermost part of the upper electrode of the nonvolatile memory element, and is contact with the side wall protective layer.

Furthermore, according to one aspect of the present disclosure, a method of manufacturing a nonvolatile memory device includes forming a plurality of nonvolatile memory elements each having an upper electrode, a lower electrode, and a variable resistance layer disposed between the lower electrode and the upper electrode, the variable resistance layer having a resistance value that reversibly changes according to an electrical signal applied to the variable resistance layer; forming a first insulating layer embedding the plurality of nonvolatile memory elements, the first insulating layer ranging from a lowermost part of the lower electrode to a position higher than an uppermost part of the upper electrode in each of the nonvolatile memory elements; forming, on the first insulating layer, a second insulating layer having an average size of vacancies larger than average size of vacancies included in the first insulating layer or having an average carbon concentration higher than an average carbon concentration of the first insulating layer; and forming a conductive layer penetrating the second insulating layer and a part of the first insulating layer, the conductive layer being connected to at least one of the upper electrodes included in the nonvolatile memory elements.

According to this aspect, since the second insulating layer having the small mechanical strength is not contact with the upper electrode in the nonvolatile memory device, it is possible to suppress the pattern defect due to the peeling between the second insulating layer and the upper electrode.

Furthermore, according to another aspect of the present disclosure, a method of manufacturing a nonvolatile memory device includes forming a plurality of nonvolatile memory elements each having an upper electrode, a lower electrode, and a variable resistance layer disposed between the lower electrode and the upper electrode, the variable resistance layer having a resistance value that reversibly changes according to an electrical signal applied to the variable resistance layer; forming a plurality of side wall protective layers each covering a side surface of at least variable resistance layer among the side walls of the nonvolatile memory elements; forming a first insulating layer embedding the plurality of nonvolatile memory elements, the first insulating layer ranging from a lowermost part of the lower electrode to a position higher than an uppermost part of the upper electrode in each of the nonvolatile memory elements; forming, on the first insulating layer, a second insulating layer having an average size of vacancies larger than average size of vacancies included in the first insulating layer, or having an average carbon concentration higher than an average carbon concentration of the first insulating layer; and forming a conductive layer penetrating the second insulating layer and a part of the first insulating layer, the conductive layer being connected to at least one of the upper electrodes included in the nonvolatile memory elements.

According to this aspect, since the side wall protective layer is provided, it is possible to suppress entering of the oxygen into the side surface of the variable resistance layer from the interlayer insulating layer, in the process of forming the interlayer insulating layer and in a heat treatment process in a production process after the nonvolatile memory element has been formed. As a result, it is possible to suppress oxidation of the side surface of the variable resistance layer, and a variation in effective cross-sectional area of the variable resistance layer.

Study Example

The inventors of the present disclosure earnestly have studied how to reduce power consumption at the time of writing and reading information in the nonvolatile memory element, and to increase operation speed, in the nonvolatile memory device. As a result, following knowledge has been obtained. The following knowledge helps to understand exemplary embodiments which will be described below. However, the present disclosure is not limited to those descriptions.

The inventors of the present disclosure have studied a nonvolatile memory device having a structure in which a nonvolatile memory element and a line formed above the nonvolatile memory element are directly connected. Specifically, the nonvolatile memory device in this study includes the nonvolatile memory element i) including a lower electrode, an upper electrode, and a variable resistance layer made of a metal oxide, interposed between the lower electrode and the upper electrode, and ii) having a resistance value which reversibly changes according to an electrical signal applied between both of the electrodes. Furthermore, another nonvolatile memory device in an study example includes i) an insulating layer that covers the lower electrode, the variable resistance layer, and the upper electrode, and ii) a line formed in the insulating layer so as to be connected to the upper electrode in the nonvolatile memory element.

The inventors of the present disclosure has studied a low-dielectric-constant insulating layer having a relative dielectric constant lower than a relative dielectric constant of silicon oxide film as a material of the insulating layer, in order to reduce parasitic capacity between the lines connected to the separated and adjacent nonvolatile memory elements, respectively. Here, it is to be noted that the low-dielectric-constant insulating layer is an insulating layer having cavities, for example. However, as for the low-dielectric-constant insulating layer having the cavities, its film density is low, and its mechanical strength and adhesion strength of a film surface are smaller than those of the silicon oxide film. Consequently, when a load is applied to a semiconductor wafer in a chemical mechanical polishing (CMP) process, for example, film peeling is likely to occur.

Furthermore, the film peeling of the low-dielectric-constant insulating layer is likely to occur between the low-dielectric-constant insluting layer and a film having a high internal stress.

For example, in a case where the upper electrode is made of iridium (Ir), an internal compressive stress of the iridium film reaches −2 GPa. In this case, when the low-dielectric-constant insulating layer is used for the insulating layer, the insulating layer is likely to be peeled from the upper electrode.

That is, there is a trade-off relationship between to employ the insulating layer capable of reducing the parasitic capacity between the separated and adjacent lines, and to employ the insulating layer capable of reducing the possibility of film peeling in the nonvolatile memory element.

Such problem could arise not only in the case where the line is formed in the insulating layer, but also in a case where the via is formed as the conductive layer in the insulating layer. In addition, in this specification, when the conductive layer is provided across the plurality of nonvolatile memory elements so as to be connected to the plurality of nonvolatile memory elements, the conductive layer is referred to as the line. Furthermore, when the conductive layer is connected to the single nonvolatile memory element, the conductive layer is referred to as the via. That is, in this specification, conceptually, the conductive layer includes both of the line and the via.

Based on the above new knowledge, the inventors of the present disclosure has conceived a configuration in which the nonvolatile memory element is covered with a first insulating layer having high peel resistance, and a second insulating layer capable of reducing parasitic capacity is disposed between the lines (or vias). According to this configuration, since the second insulating layer and the upper electrode are not directly in contact with each other, the low-dielectric-constant film having the relatively small mechanical strength can be used between the conductive layers. As a result, the parasitic capacity between the conductive layers can be reduced, so that it is possible to suppress an increase in power consumption and an operation delay due to the charging and discharging of the nonvolatile memory element.

The exemplary embodiments which will be described below are provided to solve the above problems, and each of them shows one specific example of the present disclosure. Numerical values, shapes, material, components, positions and connected ways of the components, processes, and the order of the processes shown in the following exemplary embodiments are mere examples, and the present disclosure is not limited to those. Furthermore, among the components in the following exemplary embodiments, a component which is not described in an independent claim showing a top concept is described as an optional component.

Furthermore, a description of one having the same reference sign in the drawings is sometimes omitted. In addition, the components are schematically shown for easy understanding in the drawing, so that their shapes and dimension ratios are not accurately displayed in some cases. Furthermore, as for a manufacturing method, the order of the processes can be changed, and another well-known process may be added as needed.

Figure 1:
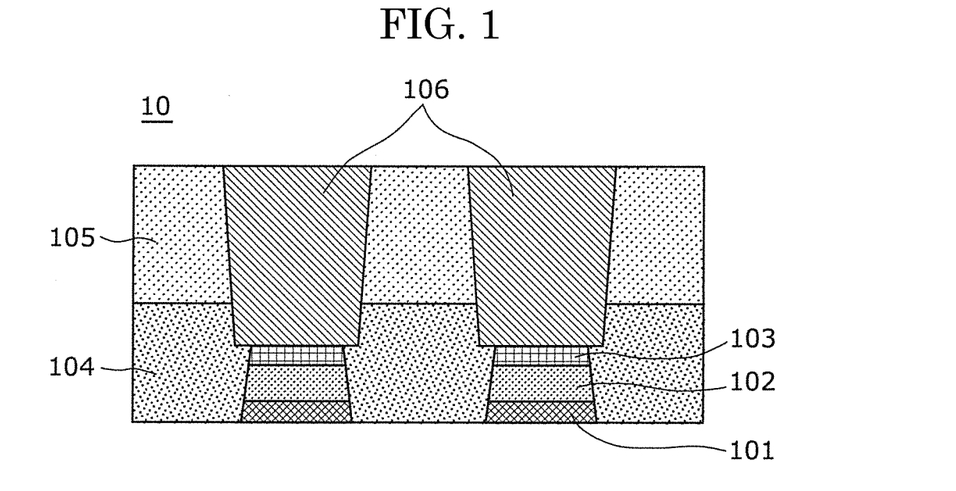
FIG. 1 is a cross-sectional view schematically showing an exemplary configuration in a first exemplary embodiment of a nonvolatile memory device including a nonvolatile memory element according to the present disclosure.

Nonvolatile Memory Element and Method for Producing the Same According to One Aspect of the Present Disclosure First Exemplary Embodiment Device Configuration FIG. 1 is a cross-sectional view showing a configuration of a variable resistance nonvolatile memory device according to a first exemplary embodiment of the present disclosure. A variable resistance nonvolatile memory device 10 shown in FIG. 1 includes a plurality of nonvolatile memory elements each having a lower electrode 101, an upper electrode 103, and a variable resistance layer 102 made of a metal oxide, interposed between the lower electrode 101 and the upper electrode 103, and having a resistance value which reversibly changes according to an electrical signal applied between both of the electrodes, a first insulating layer 104 embedding the plurality of nonvolatile memory elements and ranging from a lowermost part of the lower electrode 101 to a position higher than an uppermost part of the upper electrode 103 in each of the nonvolatile memory elements, a second insulating layer 105 formed on the first insulating layer 104, and having an average size of vacancies larger than average size of vacancies included in first insulating layer 104, or having an average carbon concentration higher than an average carbon concentration of the first insulating layer 104, and a conductive layer 106 penetrating the second insulating layer 105 and a part of the first insulating layer 104 and being connected to at least one of the upper electrodes 103 of the nonvolatile memory elements.

Here, the "electrical signal applied between both of the electrodes" refers to a voltage applied between both of the electrodes, or a current flowing between both of the electrodes.

Here, for example, the lower electrode 101, the variable resistance layer 102, and the upper electrode 103 are stacked in this order on a substrate or an interlayer insulating layer in a lower layer (not shown), and form each of the nonvolatile memory elements. In this specification, a higher position in the stacked direction is referred to as an upper part, and a lower position therein is referred to as a lower part.

The lower electrode 101 is composed of a lower electrode material layer. A standard electrode potential of the lower electrode material may be lower than that of an upper electrode material layer of the upper electrode 103. A thickness of the lower electrode 101 may be between 5 nm and 100 nm (inclusive), for example.

In a case where the variable resistance layer 102 is made of a tantalum oxide as will be described below, the lower electrode material layer can be made of at least one of tantalum nitride (TaN), titanium nitride (TiN), tungsten (W), nickel (Ni), tantalum (Ta), titanium (Ti), and aluminum (Al), for example.

In the example shown in FIG. 1, the upper electrode 103 is connected to the conductive layer 106. The upper electrode 103 is composed of the upper electrode material layer. For example, a standard electrode potential of the upper electrode material may be higher than that of a metal contained in the metal oxide included in the variable resistance layer 102, and that of the lower electrode material included in the lower electrode 101.

The upper electrode 103 may contain at least one of iridium (Ir), platinum (Pt), gold (Au), silver (Ag), and palladium (Pd). In addition, in the case where any of those materials is used, a film thickness of the upper electrode 103 may be 50 nm or less. In this configuration, a stress of the upper electrode 103 can be −3 GPa or less. Therefore, for example, when a stress due to thermal expansion or the like generated in a production process after the first insulating layer 104 has been formed is applied to the upper electrode 103 and the first insulating layer 104, the upper electrode 103 and the first insulating layer 104 can be suppressed being peeled.

In the case where the tantalum oxide is used as the metal oxide of the variable resistance layer 102, for example, at least one of iridium (Ir), platinum (Pt), palladium (Pd), gold (Au), copper (Cu), and silver (Ag) can be used as the upper electrode material.

In the case where the tantalum oxide is used as the material of the variable resistance layer 102, a relationship of $V_{Ta}<V_2$, and $V_1<V_2$ may be satisfied, wherein $V_1$ represents the standard electrode potential of the lower electrode material, $V_{Ta}$ represents a standard electrode potential of tantalum, and $V_2$ represents the standard electrode potential of the upper electrode material. In this configuration, it is possible to cause a resistance change phenomenon stably, because a redox reaction selectively occurs in the vicinity of an interface between the upper electrode 103 and the variable resistance layer 102. When $V_1<V_{Ta}$ is satisfied, it is possible to cause a resistance change phenomenon more stably in the vicinity of the interface between the upper electrode 103 and the variable resistance layer 102. In a case where a metal oxide other than the tantalum oxide is used as the material of the variable resistance layer 102, a standard electrode potential of this metal may be used instead of the above $V_{Ta}$. The thickness of the upper electrode 103 can be between 5 nm and 100 nm (inclusive), for example.

The variable resistance layer 102 is interposed between the lower electrode 101 and the upper electrode 103, and is a layer having a resistance value that reversibly changes according to the electrical signal applied between the lower electrode 101 and the upper electrode 103. For example, the variable resistance layer 102 is a layer that reversibly transits between a high resistance state and a low resistance state according to a polarity of a voltage applied between the lower electrode 101 and the upper electrode 103. The variable resistance layer 102 may be composed of a single metal oxide layer having a predetermined oxygen content atomic percentage.

Furthermore, the variable resistance layer 102 may be composed of a plurality of metal oxide layers each having a different composition. That is, the variable resistance layer 102 may be configured of at least two stacked layers of a first variable resistance layer connected to the lower electrode 101, and a second variable resistance layer connected to the upper electrode 103. In this case, the first variable resistance layer is made of a first oxygen-deficient metal oxide, and the second variable resistance layer is made of a second metal oxide having a degree of oxygen deficiency lower than the first metal oxide. The second variable resistance layer of the nonvolatile memory element has a minute local region having a degree of oxygen deficiency that reversibly changes according to application of an electric pulse. The local region is supposed to include a filament configured from oxygen defect sites.

A first metal included in the first metal oxide may be different from a second metal included in the second metal oxide. In this case, the degree of oxygen deficiency of the second metal oxide is lower than that of the first metal oxide, that is, resistance of the second metal oxide may be higher than the resistance of the first metal oxide. According to this configuration, most of the voltage applied between the lower electrode and the upper electrode to change the resistance is applied to the second metal oxide, so that the redox reaction can be more likely to occur in the second metal oxide.

Furthermore, when a different metal is used for the first metal included in the first metal oxide forming the first variable resistance layer and the second metal included in the second metal oxide forming the second variable resistance layer, the standard electrode potential of the second metal may be lower than the standard electrode potential of the first metal. The standard electrode potential indicates a property of showing less susceptibility to oxidation as its value increases. Thus, the redox reaction is likely to occur in the second metal oxide having the relatively low standard electrode potential. In addition, it is thought that the resistance change phenomenon occurs because the redox reaction occurs in the minute local region formed in the second metal oxide having the high resistance, and the filament (conductive path) changes, so that the resistance value (degree of oxygen deficiency) changes.

For example, by using an oxygen-deficient tantalum oxide (TaO$_x$) for the first metal oxide and using a titanium oxide (TiO$_2$) for the second metal oxide, a stable resistance changing operation can be obtained. Titanium (standard electrode potential=−1.63 eV) is a material having a lower standard electrode potential than tantalum (standard electrode potential=−0.6 eV). In this manner, by using an oxide of a metal having a lower standard electrode potential than the first metal oxide for the second metal oxide, the redox reaction occurs more easily in the second metal oxide. As other combinations, an aluminum oxide (Al$_2$O$_3$) can be used for the second metal oxide that becomes a high resistance layer. For example, an oxygen-deficient tantalum oxide (TaO$_x$) may be used for the first metal oxide, and an aluminum oxide (Al$_2$O$_3$) may be used for the second metal oxide.

"Degree of oxygen deficiency" refers to the percentage of deficient oxygen with respect to the amount of oxygen comprising an oxide of the stoichiometric composition (in the case where there are plural stoichiometric compositions, the stoichiometric composition having the highest resistance value among the stoichiometric compositions) in the metal oxide. Compared to a metal oxide with another composition, a metal oxide having a stoichiometric composition is more stable and has a higher resistance value.

For example, when the metal is tantalum (Ta), the oxide having the stoichiometric composition according to the above-described definition is Ta$_2$O$_5$. Here, Ta$_2$O$_5$ can be equivalently expressed as TaO$_{2.5}$. The degree of oxygen deficiency of TaO$_{2.5}$ is 0%, and the degree of oxygen deficiency of TaO$_{1.5}$ becomes: degree of oxygen deficiency=(2.5−1.5)/2.5=40%. Furthermore, a metal oxide having excess oxygen has a degree of oxygen deficiency with a negative value. It should be noted that in this specification, unless stated otherwise, the degree of oxygen deficiency includes positive values, 0 (zero), and negative values.

An oxide having a lower degree of oxygen deficiency has a higher resistance value since it is closer to an oxide having a stoichiometric composition, and an oxide having a higher degree of oxygen deficiency has a lower resistance value since it is closer to the metal included in the oxide.

The "oxygen content atomic percentage" is the percentage of the total number of atoms occupied by oxygen atoms. For example, the oxygen content atomic percentage of Ta$_2$O$_5$ is the percentage of the total number of atoms occupied by oxygen atoms (O/(Ta+O)), and becomes 71.4 atm %. Therefore, an oxygen-deficient tantalum oxide has an oxygen content atomic percentage greater than 0 and less than 71.4 atm %. For example, when the metal included in a first metal oxide layer and the metal included in a second metal oxide layer are of the same type, the oxygen content atomic percentage is in a correspondence relation with the degree of oxygen deficiency. In other words, when the oxygen content atomic percentage of the second metal oxide is higher than the oxygen content atomic percentage of the first metal oxide, the degree of oxygen deficiency of the second metal oxide is lower than the degree of oxygen deficiency of the first metal oxide.

The metal included in the variable resistance layer may be a metal other than tantalum. A transition metal, or aluminum (Al) may be used as the metal included in the variable resistance layer. For example, the transition metal may be at least one of tantalum (Ta), titanium (Ti), hafnium (Hf), zirconium (Zr), niobium (Nb), tungsten (W), and nickel (Ni). The above metal can take a plurality of oxidation states, so that the different resistive states can be implemented by the redox reaction. A thickness of the variable resistance layer 102 can be between 5 nm and 100 nm (inclusive), for example.

The nonvolatile memory element may be implemented as a nonvolatile memory element such as a resistance random access memory (ReRAM), phase change random access memory (PRAM), magnetoresistive random access memory (MRAM), or conductive bridging random access memory (CBRAM).

In the case where the nonvolatile memory element is implemented as the nonvolatile memory element of the ReRAM, it is thought that the resistance change phenomenon occurs in the variable resistance layer having the stacked structure because the redox reaction occurs in the minute local region formed in the second metal oxide having high resistance, and the filament (conductive path) in the local region changes, so that the resistance value of the local region changes. Specifically, when a voltage that is positive with respect to the lower electrode is applied to the upper electrode connected to the second metal oxide, oxygen ions in the variable resistance layer are pulled toward the second metal oxide-side. With this, a redox reaction occurs in the minute local region formed in the second metal oxide, and the degree of the oxygen deficiency decreases. As a result, it is thought that it becomes difficult for the filament inside the local region to connect, and the resistance value of the local region increases.

Conversely, when a voltage that is negative with respect to the lower electrode is applied to the upper electrode connected to the second metal oxide, oxygen ions in the second metal oxide are pushed toward the first metal oxide-side. With this, a redox reaction occurs in the minute local region formed in the second metal oxide, and the degree of oxygen deficiency increases. As a result, it is thought that it becomes easy for the filament inside the local region to connect, and the resistance value of the local region decreases.

The first insulating layer 104 is formed so as to cover the lower electrode 101, the variable resistance layer 102, and the upper electrode 103 of the nonvolatile memory element. The first insulating layer 104 provided above the upper electrode 103 is between 20 nm and 500 nm (inclusive) in thickness, for example, and may be composed of silicon oxide series tetraethoxysilane (TEOS) film or the like. Vacancies hardly exist in TEOS, and its size is 1 nm or less. Furthermore, the film has a carbon concentration of 2% or less and a relative dielectric constant of about 4.

The second insulating layer 105 is deposited on an upper surface of the first insulating layer 104. The second insulating layer 105 is between 20 nm and 500 nm (inclusive) in thickness, for example, and has a porous structure having many vacancies whose relative dielectric constant is close to that of vacuum, in the film. In addition, the second insulating layer 105 has the average size of vacancies larger than that of the first insulating layer 104. As for a method of forming the second insulating layer 105, a starting material is prepared such that trimethylsilane or tetramethylsilane is mixed with an organic compound having a cyclic molecule structure composed of Si—O coupling what is called porogen (such as cyclic siloxane). With this starting material, a SiOC series silicon oxide film is formed by plasma CVD, and then irradiated with ultraviolet light, whereby the second insulating layer is formed.

A size distribution of vacancies is measured by a small angle X-ray scattering (SAXS) method. An average size of vacancies is determined by calculating an average value of the measured each size of vacancies. The average size of vacancies is approximately between 2 nm and 6 nm (inclusive) in diameter, for example.

A carbon concentration in the insulating layer is measured by auger electron spectroscopy (AES). The carbon concentration in the insulating layer is approximately 10 atm % to 30 atm % (inclusive). A relative dielectric constant of the insulating layer is calculated based on insulating layer capacity between lines, a film thickness between the lines, and an area determined from a depth and a length of the line. The relative dielectric constant of the insulating layer is between 2.2 and 2.8 (inclusive), for example.

The conductive layer 106 which is formed in the first insulating layer 104 and the second insulating layer 105, and is contact with the upper electrode 103 can be composed of an adhesion layer which is contact with the upper electrode 103, the first insulating layer 104, and the second insulating layer 105; and a filling layer formed inside the adhesion layer. For example, the adhesion layer may be made of at least one of tantalum (Ta), tantalum nitride (TaN), titanium (Ti), titanium nitride (TiN), and ruthenium (Ru). For example, the filling layer may be made of material containing copper (Cu) as a primary component.

The conductive layer 106 may serve as a line, for example. Such a line serving as the conductive layer is connected to the upper electrodes of the shown nonvolatile memory element and one or more nonvolatile memory elements (not shown) disposed in line with that nonvolatile memory element on a front side or back side. Alternatively, the conductive layer 106 may serve as a via, for example. Such a via as the conductive layer is connected to the upper electrode of the single nonvolatile memory element.

When the conductive layer 106 serves as the line, a minimum line width of the conductive layer 106 can be between 20 nm and 120 nm (inclusive). A minimum separation width between adjacent the conductive layers 106 can be between 20 nm and 120 nm (inclusive).

According to the nonvolatile memory device having the above configuration, the second insulating layer 105 is not directly in contact with the upper electrode 103, and the second insulating layer 105 having the dielectric constant lower than that of the first insulating layer 104 is disposed beside the conductive layer 106. As a result, it is possible to suppress the second insulating layer 105 and the upper electrode 103 from being peeled. In addition, parasitic capacity between the conductive layers 106 is low, so that even when a potential difference is generated between adjacent the conductive layers 106, it is possible to suppress power consumption from increasing and operation speed from decreasing due to charging and discharging when information is written to or read from the selected nonvolatile memory element.

A method of manufacturing the nonvolatile memory device according to the first exemplary embodiment includes: forming the plurality of nonvolatile memory elements each having the upper electrode, the lower electrode, and the variable resistance layer disposed between the lower electrode and the upper electrode, the variable resistance layer having a resistance value which reversibly changes according to the electrical signal applied to the variable resistance layer; forming the first insulating layer embedding the plurality of nonvolatile memory elements and ranging from the lowermost layer of the lower electrode to the position higher than the uppermost part of the upper electrode in each of the nonvolatile memory elements; forming, on the first insulating layer, the second insulating layer having the average size of vacancies larger than average size of vacancies included in the first insulating layer or the average carbon concentration higher than the average carbon concentration of the first insulating layer; and forming the conductive layer penetrating the second insulating layer and a part of the first insulating layer and being connected to at least one of the upper electrodes of the nonvolatile memory elements.

According to the nonvolatile memory device having the above configuration, the second insulating layer 105 having low mechanical strength is not directly in contact with the upper electrode 103, so that it is possible to suppress a pattern defect caused due to peeling between the second insulating layer 105 and the upper electrode 103. Furthermore, the first insulating layer 104, and the second insulating layer 105 having the relative dielectric constant lower than that of the first insulating layer 104 are disposed beside the conductive layer 106, so that compared with the case where the conductive layer 106 is embedded only with the first insulating layer 104, it is possible to reduce the power consumption and increase the operation speed when the information is written to or read from the selected nonvolatile memory element.

[Manufacturing Method]

Hereinafter, a method of manufacturing the nonvolatile memory device 10 including the nonvolatile memory element according to the first exemplary embodiment of the present disclosure will be specifically described.

Here, FIGS. 2A to 2F are schematic cross-sectional views each showing a process in the method of manufacturing nonvolatile memory device 10 shown in FIG. 1.

Figure 2A:
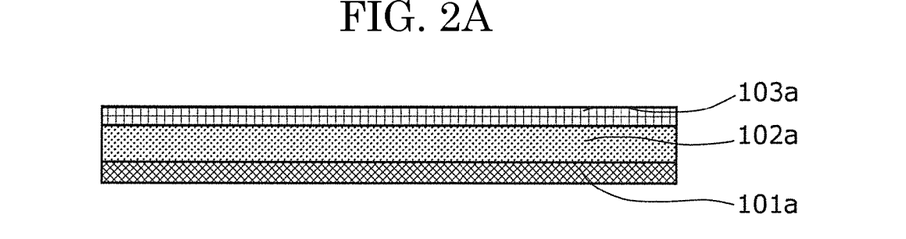
FIG. 2A is a cross-sectional view showing a process of forming a lower electrode material layer, a variable resistance material layer, and an upper electrode material layer in this order, in an example of a method of manufacturing the nonvolatile memory device according to the first exemplary embodiment.

FIG. 2A shows a process of sequentially depositing a lower electrode material layer 101a, a variable resistance material layer 102a, and an upper electrode material layer 103a.

More specifically, tantalum nitride (TaN) is deposited to be between 5 nm and 20 nm (inclusive) in thickness, as the lower electrode material layer by sputtering, for example. The method of depositing the tantalum nitride is the sputtering here, but it may be chemical vapor deposition (CVD), or atomic layer deposition (ALD).

Then, a tantalum oxide is deposited to be between 10 nm and 50 nm (inclusive) in thickness on the tantalum nitride layer, as the variable resistance material layer by reactive sputtering performed in an atmosphere containing oxygen with tantalum used as a target.

Then, iridium (Ir) is deposited to be between 10 nm and 60 nm (inclusive) in thickness on the tantalum oxide layer, as the upper electrode material layer by sputtering.

Figure 2B:
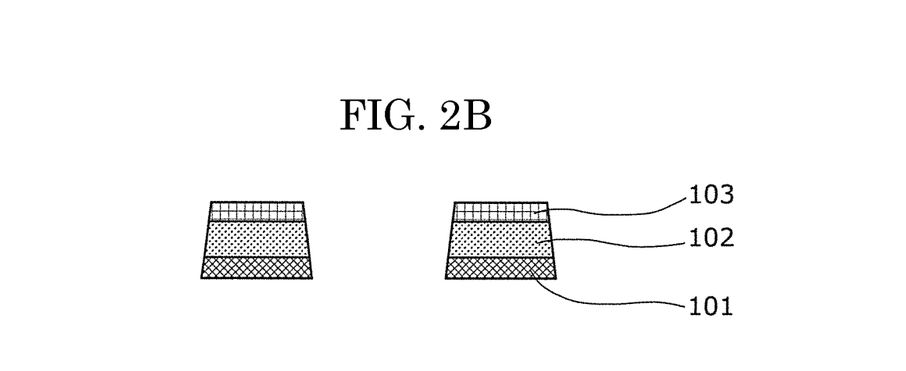
FIG. 2B is a cross-sectional view showing a process of forming a lower electrode, a variable resistance layer, and an upper electrode layer, in an example of the method of manufacturing the nonvolatile memory device according to the first exemplary embodiment.

FIG. 2B shows a process of forming the nonvolatile memory element including the lower electrode, the upper electrode, and the variable resistance layer interposed between the lower electrode and the upper electrode. The process shown in FIG. 2B is continuously performed after the process shown in FIG. 2A.

Specifically, the lower electrode 101, the variable resistance layer 102, and the upper electrode 103 are formed by processing the lower electrode material layer 101a, the variable resistance material layer 102a, and the upper electrode material layer 103a by dry etching with a desired mask.

A dimension of the nonvolatile memory element may be roughly a rectangular shape having a side of 60 nm, or roughly a circular shape having a diameter of 60 nm, for example.

Figure 2C:
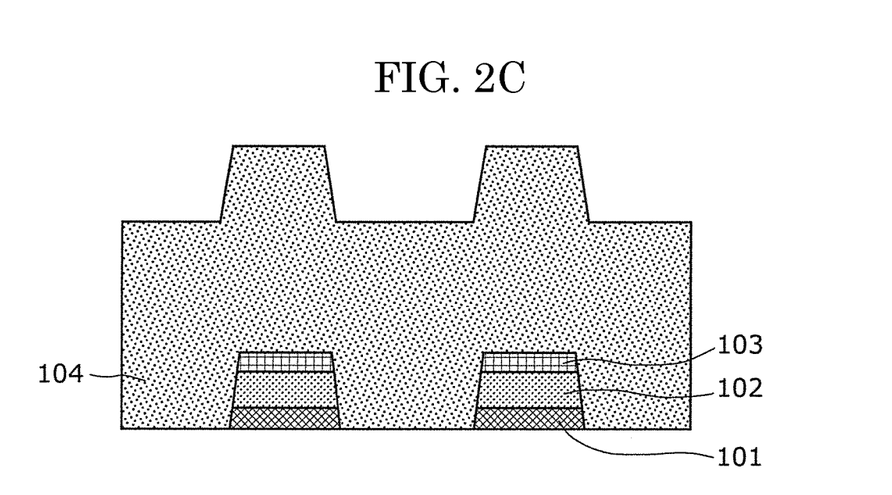
FIG. 2C is a cross-sectional view showing a process of depositing a first insulating layer to cover the lower electrode, the variable resistance layer, and the upper electrode layer, in an example of the method of manufacturing the nonvolatile memory device according to the first exemplary embodiment.

FIG. 2C shows a process of depositing the first insulating layer so as to cover the nonvolatile memory element, and fill the space between the adjacent nonvolatile memory elements. The process shown in FIG. 2C is continuously performed after the process shown in FIG. 2B. Specifically, the first insulating layer 104 containing a silicon oxide as a primary component is deposited to be 500 nm in thickness by plasma CVD.

Figure 2D:
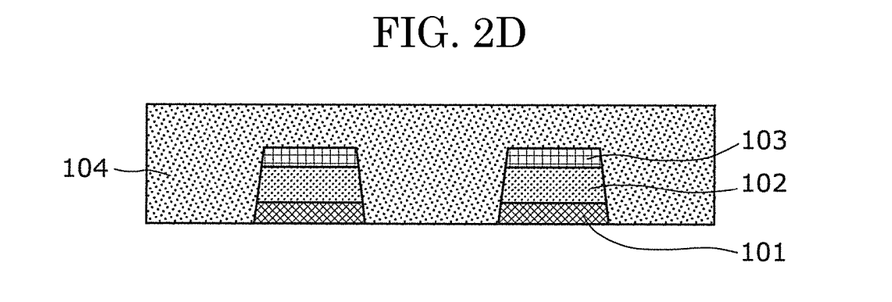
FIG. 2D is a cross-sectional view showing a process of planarizing the first insulating layer, in an example of the method of manufacturing the nonvolatile memory device according to the first exemplary embodiment.

FIG. 2D shows a process of planarizing the first insulating layer. The process shown in FIG. 2D is continuously performed after the process shown in FIG. 2C.

Specifically, the first insulating layer 104 is planarized by CMP so that its film thickness above the upper electrode 103 becomes 100 nm, for example.

Figure 2E:
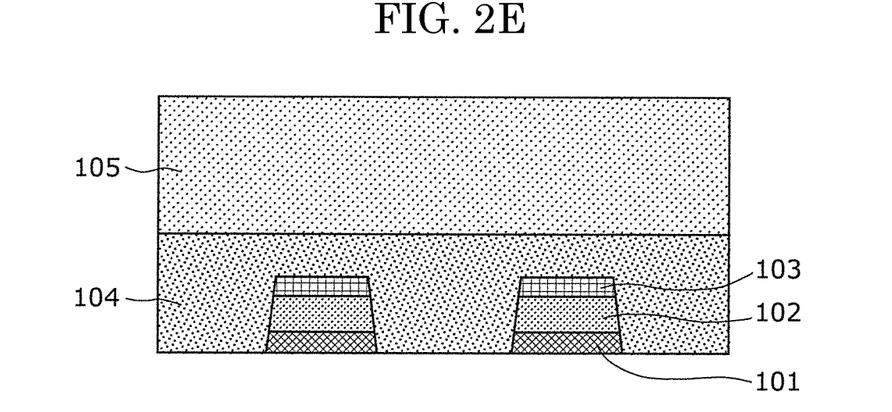
FIG. 2E is a cross-sectional view showing a process of depositing a second insulating layer on an upper surface of the first insulating layer, in an example of the method of manufacturing the nonvolatile memory device according to the first exemplary embodiment.

FIG. 2E shows a process of depositing the second insulating layer on the first insulating layer. The process shown in FIG. 2E is continuously performed after the process shown in FIG. 2D.

Specifically, the second insulating layer has a film thickness of about 200 nm, and its starting material is provided such that trimethylsilane or tetramethylsilane is mixed with the organic compound having the cyclic molecule structure composed of Si—O coupling what is called porogen (such as cyclic siloxane). With this starting material, the SiOC series silicon oxide film is formed by plasma CVD. Then, the film is irradiated with ultraviolet light generated from a high-pressure mercury lamp at a temperature of 400° C. under a pressure of 75 Torr for 600 seconds, whereby vacancies are formed in the film, and the film is changed to a porous insulating layer having the low dielectric constant.

Figure 2F:
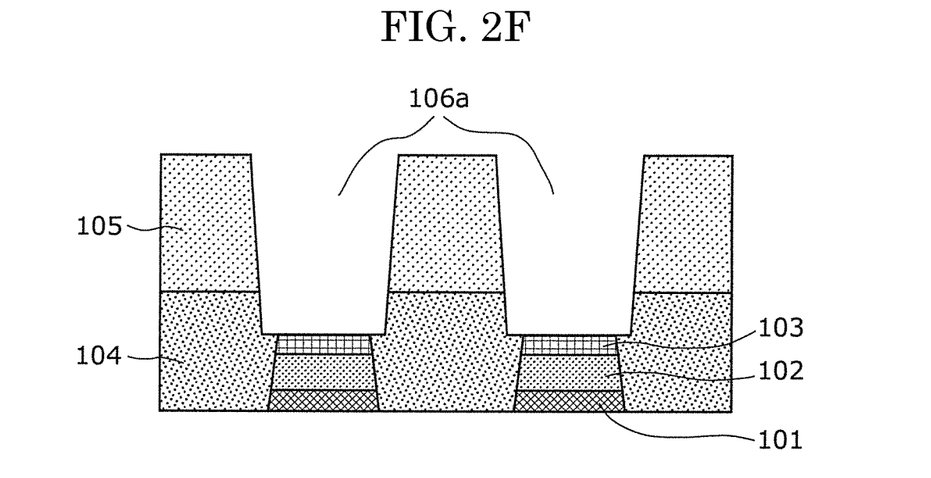
FIG. 2F is a cross-sectional view showing a process of forming a line trench (or via hole) in the first insulating layer and the second insulating layer so that the upper electrode is exposed, in an example of the method of manufacturing the nonvolatile memory device according to the first exemplary embodiment.

FIG. 2F shows a process of forming the conductive layer (line or via) to be connected to the upper electrode of the nonvolatile memory element, in the first insulating layer and the second insulating layer. The process shown in FIG. 2F is continuously performed after the process shown in FIG. 2E.

Specifically, a line trench (or via hole) 106a having a desired shape is formed by processing a second insulating layer 105 and the first insulating layer 104 by dry etching with a desired mask so that at least a part of the upper electrode 103 is exposed. Then, a tantalum nitride layer (thickness is 5 nm), and a tantalum layer (thickness is 5 nm) are deposited as the adhesion layer on a whole surface by ALD. Then, copper (Cu) is deposited to be 300 nm in thickness as the filling layer on a whole surface by electrolytic plating. Then, the material of the adhesion layer and the material of the filling layer deposited on second insulating layer 105 are removed by chemical mechanical polishing (CMP), whereby conductive layer 106 is formed as the line. For example, a width of conductive layer 106 as the line can be 45 nm, and a thickness thereof can be 80 nm.

Second Exemplary Embodiment
[Device Configuration]

Figure 3:
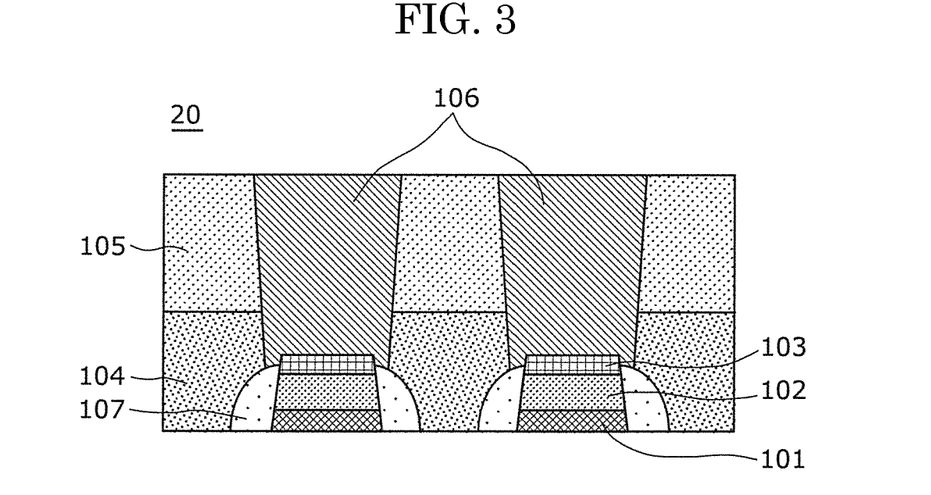
FIG. 3 is a cross-sectional view schematically showing an exemplary configuration in a second exemplary embodiment of a nonvolatile memory device including a nonvolatile memory element according to the present disclosure.

FIG. 3 is a cross-sectional view showing a configuration of a variable resistance nonvolatile memory device according to a second exemplary embodiment of the present disclosure. Variable resistance nonvolatile memory device 20 shown in FIG. 3 includes a plurality of nonvolatile memory elements each having the lower electrode 101, the upper electrode 103, and the variable resistance layer 102 interposed between the lower electrode 101 and the upper electrode 103, made of a metal oxide, the variable resistance layer having a resistance value which reversibly changes according to an electrical signal applied between both of the electrodes, the first insulating layer 104 embedding the plurality of nonvolatile memory elements and ranging from a lowermost part of the lower electrode 101 to a position higher than an uppermost part of the upper electrode 103 in each of the nonvolatile memory elements, the second insulating layer 105 formed on the first insulating layer 104, and having an average size of vacancies larger than average size of vacancies included in first insulating layer 104, or having an average carbon concentration higher than an average carbon concentration of the first insulating layer 104, a conductive layer 106 penetrating the second insulating layer 105 and a part of the first insulating layer 104 and connected to at least one of the upper electrodes 103 of the nonvolatile memory elements, and a plurality of side wall protective layers 107 covering at least a side surface of the variable resistance layer among side walls of the nonvolatile memory elements.

The nonvolatile memory device in the second exemplary embodiment differs from the nonvolatile memory device in the first exemplary embodiment in that the side wall protective layer 107 is interposed between the side part of the nonvolatile memory element composed of the lower electrode 101, the variable resistance layer 102, and the upper electrode 103, and the first insulating layer 104. Since the side wall protective layer 107 is provided, it is possible to suppress an oxidation seed from entering the side surface of the variable resistance layer 102 from the first insulating layer 104 and oxidation from proceeding in the process of depositing the first insulating layer 104, and in the process of forming the element at high temperature after the first insulating layer 104 has been deposited. As a result, it is possible to suppress a variation in effective cross-sectional area of the variable resistance layer 102.

Furthermore, since a part of the side wall of upper electrode 103, the side wall of variable resistance layer 102, and the side wall of lower electrode 101 are covered with the side wall protective layer 107, a leak path is suppressed from being formed between the conductive layer 106 and the variable resistance layer 102 when the conductive layer 106 is formed. As a result, according to the nonvolatile memory element, a variation in initial breakdown voltage can be suppressed, so that a reduction in yield can be suppressed.

(Manufacturing Method)

Next, a method of manufacturing the nonvolatile memory element according to the second exemplary embodiment of the present disclosure will be described.

Here, FIGS. 4A to 4G are schematic cross-sectional views each showing a process in the method of manufacturing the nonvolatile memory device shown in FIG. 3.

Figure 4A:
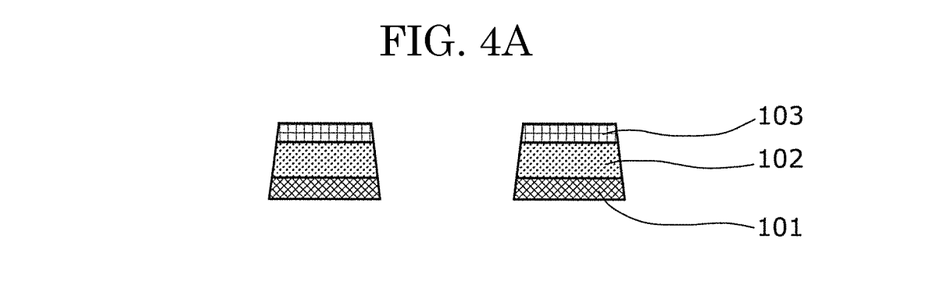
FIG. 4A is a cross-sectional view showing a process of forming a lower electrode, a variable resistance layer, and an upper electrode layer, in one example of a method of manufacturing the nonvolatile memory device according to the second exemplary embodiment.

FIG. 4A shows a process of forming the nonvolatile memory element composed of the lower electrode 101, the variable resistance layer 102, and the upper electrode 103. The process shown in FIG. 4A is the same as the processes shown in FIGS. 2A and 2B, so that its detailed description is omitted.

Figure 4B:
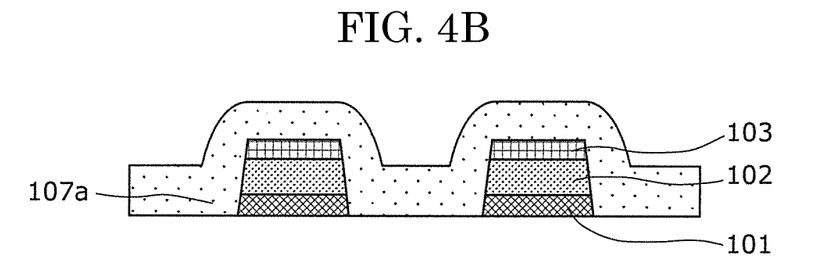
FIG. 4B is a cross-sectional view showing a process of depositing a side wall protective film to cover the lower electrode, the variable resistance layer, and the upper electrode layer, in an example of the method of manufacturing the nonvolatile memory device according to the second exemplary embodiment.

FIG. 4B shows a process of depositing side wall protective film 107a to cover the lower electrode 101, the variable resistance layer 102, and the upper electrode 103. The process shown in FIG. 4B is continuously performed after the process shown in FIG. 4A. Specifically, the side wall protective film 107a is deposited to be 20 nm in thickness by ALD, for example. The side wall protective film 107a can be made of any of silicon nitride, a silicon oxide, and silicon carbide.

Figure 4C:
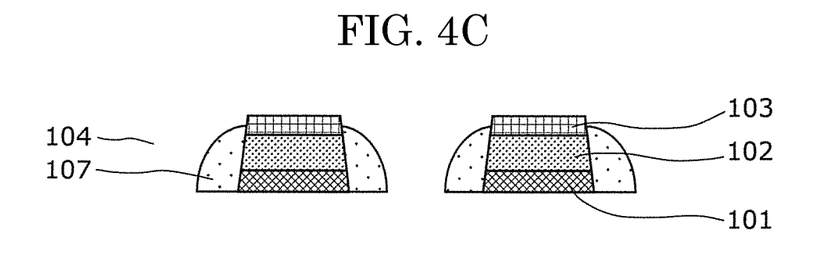
FIG. 4C is a cross-sectional view showing a process of forming a side wall protective layer by removing a part of the side wall protective film, in an example of the method of manufacturing the nonvolatile memory device according to the second exemplary embodiment.

FIG. 4C is a cross-sectional view showing a process of forming the side wall protective layer 107. The process shown in FIG. 4C is continuously performed after the process shown in FIG. 4B.

Specifically, the side wall protective film 107a is etched by dry etching, for example, so that the side wall protective layer 107 is left to cover the side walls of lower electrode 101 and the variable resistance layer 102, and a part of the side part of the upper electrode 103. A thickness of the side wall protective layer 107 can be 20 nm, for example, and a part of the side part of upper electrode 103 may not be covered with the side wall protective layer 107.

FIGS. 4B and 4C show processes for forming side wall protective layer 107 on the side part of the nonvolatile memory element.

Figure 4D:
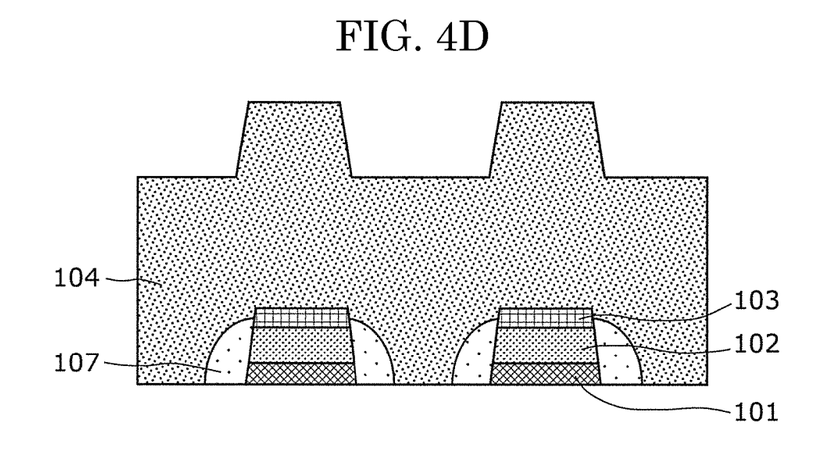
FIG. 4D is a cross-sectional view showing a process of depositing a first insulating layer so as to cover the lower electrode, the variable resistance layer, the upper electrode layer, and the side wall protective layer, in an example of the method of manufacturing the nonvolatile memory device according to the second exemplary embodiment.

FIG. 4D shows a process of depositing the first insulating layer so as to cover the nonvolatile memory element and the side wall protective layer, and fill a space between the adjacent nonvolatile memory elements. The process shown in FIG. 4D is continuously performed after the process shown in FIG. 4C.

Specifically, the first insulating layer 104 is deposited to be 500 nm in thickness by plasma CVD. At this time, the first insulating layer 104 is composed of a TEOS film, for example. Furthermore, the first insulating layer 104 covers the side wall protective layer 107, and an upper surface and a part of the side part of the upper electrode 103, and fills the space between the adjacent nonvolatile memory elements.

Figure 4E:
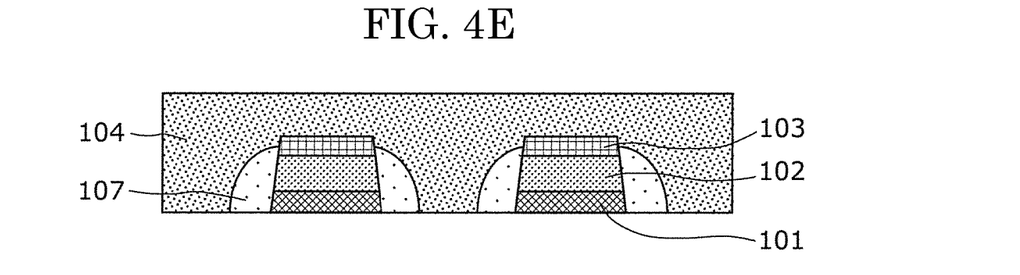
FIG. 4E is a cross-sectional view showing a process of planarizing the first insulating layer, in an example of the method of manufacturing the nonvolatile memory device according to the second exemplary embodiment.

FIG. 4E shows a process of planarizing the first insulating layer. The process shown in FIG. 4E is continuously performed after the process shown in FIG. 4D. Specifically, the first insulating layer is planarized by CMP until its film thickness above the upper electrode 103 becomes 100 nm. At this time, the upper surface and the side surface of the upper electrode 103 are not exposed.

Figure 4F:
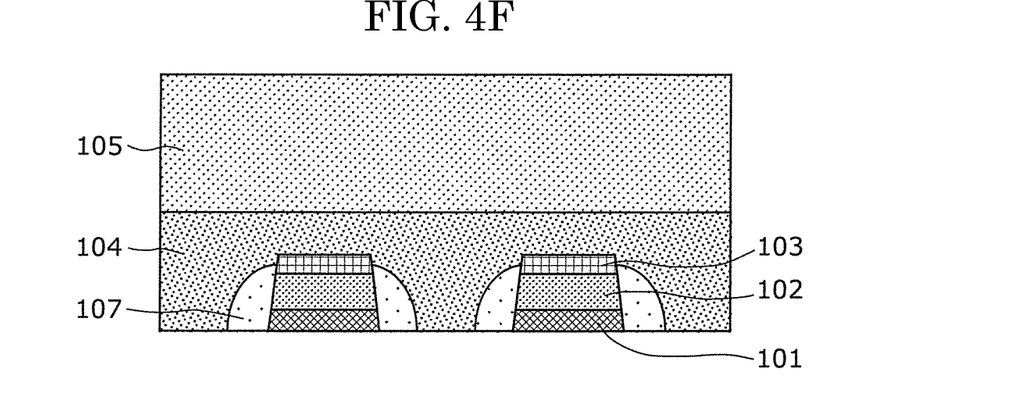
FIG. 4F is a cross-sectional view showing a process of depositing a second insulating layer on an upper surface of the first insulating layer, in an example of the method of manufacturing the nonvolatile memory device according to the second exemplary embodiment.

FIG. 4F shows a process of depositing the second insulating layer on the first insulating layer. The process shown in FIG. 4F can be the same as the process shown in FIG. 2E, so that its detailed description is omitted.

Figure 4G:
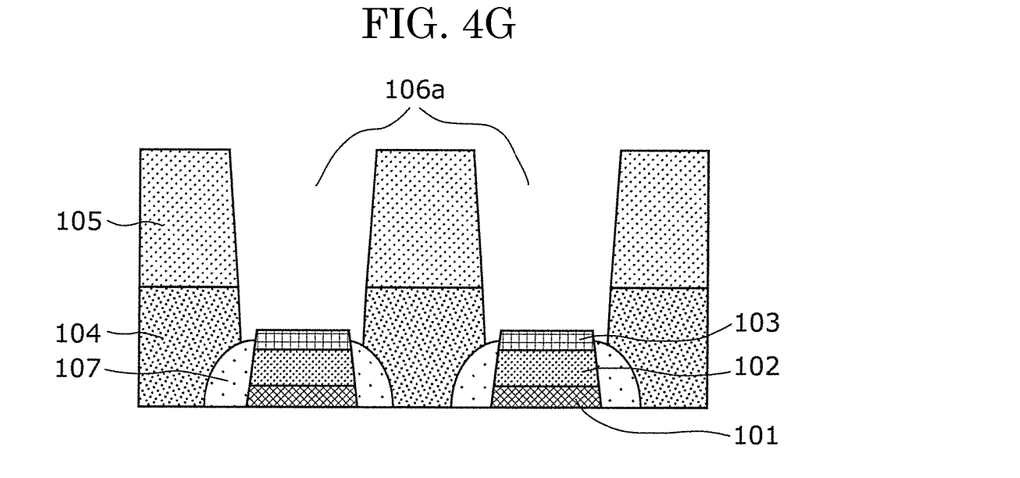
FIG. 4G is a cross-sectional view showing a process of forming a line trench (or via hole) in the first insulating layer and the second insulating layer so that the upper electrode is exposed, in an example of the method of manufacturing the nonvolatile memory device according to the second exemplary embodiment.

FIG. 4G shows a process of forming the conductive layer to be connected to the upper electrode of the nonvolatile memory element, in the first insulating layer and the second insulating layer. The process shown in FIG. 4G is continuously performed after the process shown in FIG. 4F.

Specifically, the line trench (or via hole) 106a having a desired shape is formed in the second insulating layer 105 and the first insulating layer 104 by dry etching with a desired mask so that at least one part of the upper electrode 103 is exposed.

Then, the tantalum nitride layer (thickness is 5 nm), and the tantalum layer (thickness is 5 nm) are deposited as the adhesion layer on a whole surface by ALD. Then, copper (Cu) is deposited to be 300 nm in thickness as the filling layer on a whole surface by electrolytic plating. Then, the material of the adhesion layer and the material of the filling layer deposited on the second insulating layer 105 are removed by chemical mechanical polishing (CMP), whereby the conductive layer 106 is formed. For example, the width of the conductive layer 106 as the line can be 45 nm, and a thickness thereof can be 80 nm.

The nonvolatile memory device (variable resistance element) and the method of manufacturing the same according to the present disclosure have been described with reference to the exemplary embodiments, but the present disclosure is not limited to the above exemplary embodiments. The present disclosure also includes a variable resistance nonvolatile memory element and a method of manufacturing the same which are implemented by making various modifications that may be conceived by those skilled in the art, or by arbitrarily combining the components in the above exemplary embodiments, within a scope that does not depart from the essence of the present disclosure.

For example, according to the nonvolatile memory element shown in FIG. 3, the part which is not in contact with the side wall protective layer 107, in the side wall of the upper electrode 103 is only covered with the conductive layer 106, but according to one aspect in the modification, the part which is not in contact with the side wall protective layer 107, in the side wall of upper electrode 103 in the nonvolatile memory element may be covered with both of the first insulating layer 104 and the conductive layer 106.

Figure 5:
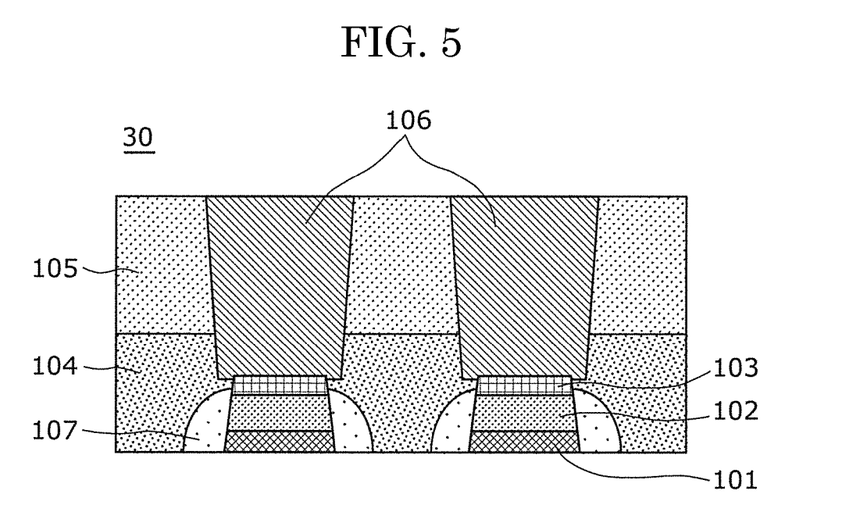
FIG. 5 is a cross-sectional view schematically showing an exemplary configuration in a modification of a nonvolatile memory device including a nonvolatile memory element according to the present disclosure.

FIG. 5 is a cross-sectional view showing a configuration of a nonvolatile memory device according to the modification.

According to the nonvolatile memory device 30 shown in FIG. 5, the part which is not in contact with the side wall protective layer 107, in the side wall of upper electrode 103 is covered with both of the first insulating layer 104 and the conductive layer 106. This structure could be formed, for example, when the lowermost part of the line trench (or via hole) 106a did not reach the side wall protective layer 107.

In addition, although not shown, in a case where the lowermost part of the line trench (or via hole) 106a is only in contact with the upper surface of the upper electrode 103, for example, the part which is not in contact with the side wall protective layer 107, in the side wall of the upper electrode 103 may be only covered with the first insulating layer 104.

Furthermore, according to one aspect of another modification, the lowermost part of the conductive layer 106 may be positioned lower than the lowermost part of the upper electrode 103 in the nonvolatile memory element.

In addition, the width or diameter of the conductive layer 106 may be smaller than the width or diameter of the nonvolatile memory element.

Figure 6:
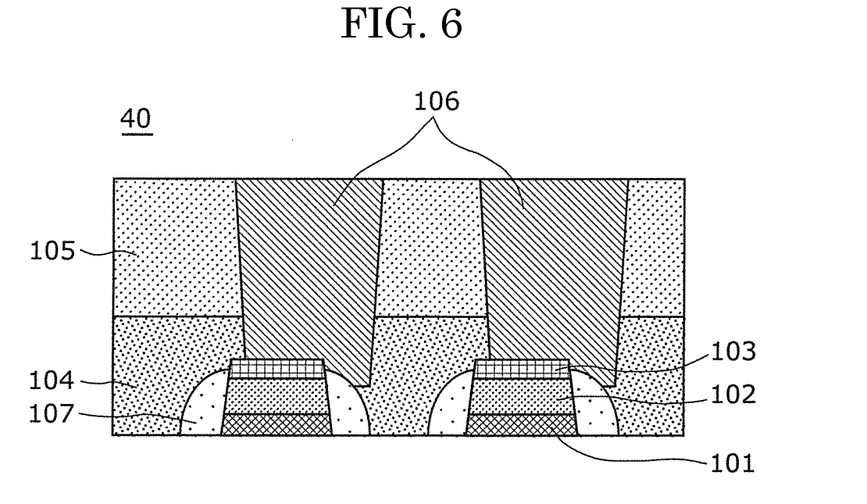
FIG. 6 is a cross-sectional view schematically showing an exemplary configuration in a modification of a nonvolatile memory device including a nonvolatile memory element according to the present disclosure.

FIG. 6 is a cross-sectional view showing a configuration of a variable resistance nonvolatile memory device according to another modification.

According to the nonvolatile memory device 40 shown in FIG. 6, the lowermost part of the conductive layer 106 reaches a part lower than an interface between the upper electrode 103 and the variable resistance layer 102. That is, the lowermost part of the conductive layer 106 is lower than the lowermost part of the upper electrode 103. This structure could be formed in a case where the line trench or via hole 106a protruded outside the width of the upper electrode 103 and was deeply formed. Even in this structure, due to the presence of the side wall protective layer 107, the conductive layer 106 and the variable resistance layer 102 are not directly connected to each other.

Furthermore, the present disclosure can be applied to another modification having a structure in which the conductive layer 106 does not protrude outside the width of the upper electrode 103, and the lowermost part of the conductive layer 106 is formed deeper than the lowermost part of the upper electrode 103. For example, in a case where the conductive layer 106 extends so as to be connected to each of the upper electrodes 103 of the two separated and adjacent nonvolatile memory elements, the lowermost part of the conductive layer 106 exists between the above two nonvolatile memory elements. In this case, the side wall protective layer 107 may be formed so as to protect at least the side surface which faces the extending direction of the conductive layer 106, of the side surfaces of the variable resistance layer 102.

The same effect as the above-described effect can be provided in each of the nonvolatile memory devices 30 and 40 according to the modification and the other modifications. That is, since the second insulating layer 105 is not in contact with the upper electrode 103, it is possible to completely suppress a pattern defect associated with the peeling between the second insulating layer 105 and the upper electrode 103. Furthermore, parasitic capacity existing between adjacent the conductive layers 106 is reduced and charging and discharging of the parasitic capacity are reduced, so that it is possible to reduce power consumption and increase operation speed when information is written to or read from the selected nonvolatile memory element among the conductive layers.

The present disclosure is useful for a nonvolatile memory device including a nonvolatile memory element having a resistance value which changes based on an applied electrical signal, and a method of manufacturing the same.

What is claimed is:

1. A nonvolatile memory device comprising:
a plurality of nonvolatile memory elements each having an upper electrode, a lower electrode, and a variable resistance layer disposed between the lower electrode and the upper electrode, the variable resistance layer having a resistance value that reversibly changes according to an electrical signal applied to the variable resistance layer;
a first insulating layer embedding the plurality of the nonvolatile memory elements, and ranging from a lowermost part of the lower electrode to a position higher than an uppermost part of the upper electrode in each of the nonvolatile memory elements;
a second insulating layer disposed on the first insulating layer, and having an average size of vacancies larger than an average size of vacancies included in the first insulating layer, or having an average carbon concentration higher than an average carbon concentration of the first insulating layer; and
a conductive layer penetrating the second insulating layer and a part of the first insulating layer and being connected to at least one of the upper electrodes of the nonvolatile memory elements.

2. The nonvolatile memory device according to claim 1, wherein
the first insulating layer is physically in contact with at least one of an upper surface and a side wall of the upper electrode included in each of the nonvolatile memory elements.

3. The nonvolatile memory device according to claim 1, wherein
a lowermost part of the conductive layer is positioned higher than a lowermost part of the upper electrode included in each of the nonvolatile memory elements.

4. The nonvolatile memory device according to claim 1, wherein
a width of the conductive layer is larger than a width of an upper surface of the upper electrode connected to the conductive layer, in each of the nonvolatile memory elements, and the conductive layer connected to the upper electrode covers the whole upper surface of the upper electrode.

5. The nonvolatile memory device according to claim 1, wherein
the conductive layer includes at least one of a line and a via.

6. The nonvolatile memory device according to claim 1, wherein
the upper electrode included in each of the nonvolatile memory elements contains at least one metal selected from the group consisting of iridium, platinum, gold, silver, and palladium.

7. A nonvolatile memory device comprising:
a plurality of nonvolatile memory elements each having an upper electrode, a lower electrode, and a variable resistance layer disposed between the lower electrode and the upper electrode, the variable resistance layer having a resistance value that reversibly changes according to an electrical signal applied to the variable resistance layer;
a first insulating layer embedding the plurality of the nonvolatile memory elements, and ranging from a lowermost part of the lower electrode to a position higher than an uppermost part of the upper electrode in each of the nonvolatile memory elements;
a second insulating layer a layer disposed on the first insulating layer, and having an average size of vacancies larger than an average size of vacancies included in the first insulating layer, or having an average carbon concentration higher than an average carbon concentration of the first insulating layer;
a conductive layer penetrating the second insulating layer and a part of the first insulating layer and connected to at least one of the upper electrodes of the nonvolatile memory elements; and
a plurality of side wall protective layers each covering a side wall of each of the nonvolatile memory elements as an insulating protective layer, and each covering at least a side surface of the variable resistance layer.

8. The nonvolatile memory device according to claim 7, wherein
a part of the side wall of the upper electrode not covered with each of the side wall protective layers is covered with at least one of the first insulating layer and the conductive layer.

9. The nonvolatile memory device according to claim 7, wherein
a lowermost part of the conductive layer is positioned between an uppermost part and a lowermost part of the upper electrode included in the nonvolatile memory element and is in contact with the side wall protective layer.

10. The nonvolatile memory device according to claim 7, wherein
a lowermost part of the conductive layer is positioned lower than a lowermost part of the upper electrode included in the nonvolatile memory element, and is in contact with the side wall protective layer.

11. The nonvolatile memory device according to claim 7, wherein
a width of the conductive layer is larger than a width of an upper surface of the upper electrode connected to the conductive layer, in each of the nonvolatile memory elements, and the conductive layer connected to the upper electrode covers the whole upper surface of the upper electrode.

12. The nonvolatile memory device according to claim 7, wherein
the upper electrode of each of the nonvolatile memory elements contains at least one metal selected from the group consisting of iridium, platinum, gold, silver, and palladium.

13. A method of manufacturing a nonvolatile memory device, the method comprising:
forming a plurality of nonvolatile memory elements each having an upper electrode, a lower electrode, and a variable resistance layer disposed between the lower electrode and the upper electrode, the variable resistance layer having a resistance value that reversibly changes according to an electrical signal applied to the variable resistance layer;
forming a first insulating layer embedding the plurality of nonvolatile memory elements, the first insulating layer ranging from a lowermost part of the lower electrode to a position higher than an uppermost part of the upper electrode in each of the nonvolatile memory elements;
forming, on the first insulating layer, a second insulating layer having an average size of vacancies larger than an average size of vacancies included in the first insulating layer or having an average carbon concentration higher than an average carbon concentration of the first insulating layer; and
forming a conductive layer penetrating the second insulating layer and a part of the first insulating layer, the conductive layer being connected to at least one of the upper electrodes of included in the nonvolatile memory elements.

14. The method of manufacturing a nonvolatile memory device according to claim 13, wherein
the first insulating layer is physically in contact with at least one of an upper surface and a side wall of the upper electrode of included in each of the nonvolatile memory elements.

15. The method of manufacturing a nonvolatile memory device according to claim 13, wherein
a lowermost part of the conductive layer is positioned higher than a lowermost part of the upper electrode included in each of the nonvolatile memory elements.

16. The method of manufacturing a nonvolatile memory device according to claim 13, wherein
a width of the conductive layer is larger than a width of an upper surface of the upper electrode connected to the conductive layer, in each of the nonvolatile memory elements, and the conductive layer connected to the upper electrode covers the whole upper surface of the upper electrode.

17. The method of manufacturing a nonvolatile memory device according to claim 13, wherein
the conductive layer is at least one of a line and a via.

18. The method of manufacturing a nonvolatile memory device according to claim 13, wherein
the upper electrode included in each of the nonvolatile memory elements contains at least one metal selected from the group consisting of iridium, platinum, gold, silver, and palladium.

* * * * *